United States Patent
Zhao et al.

(10) Patent No.: US 11,380,714 B2
(45) Date of Patent: Jul. 5, 2022

(54) ARRAY SUBSTRATE, DISPLAY PANEL AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Bin Zhao, Beijing (CN); Hanqing Liu, Beijing (CN); Xuchen Yuan, Beijing (CN); Yong Peng, Beijing (CN); Huiying Li, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 425 days.

(21) Appl. No.: 16/474,681

(22) PCT Filed: Jan. 15, 2019

(86) PCT No.: PCT/CN2019/071809
§ 371 (c)(1),
(2) Date: Jun. 28, 2019

(87) PCT Pub. No.: WO2019/227947
PCT Pub. Date: Dec. 5, 2019

(65) Prior Publication Data
US 2021/0358958 A1 Nov. 18, 2021

(30) Foreign Application Priority Data
May 31, 2018 (CN) .......................... 201810549269.3

(51) Int. Cl.
*H01L 27/12* (2006.01)
*G09G 3/36* (2006.01)

(52) U.S. Cl.
CPC ......... *H01L 27/124* (2013.01); *G09G 3/3688* (2013.01); *H01L 27/1251* (2013.01); *G09G 2310/0291* (2013.01)

(58) Field of Classification Search
None
See application file for complete search history.

(56) References Cited

U.S. PATENT DOCUMENTS

| 6,713,748 B1 | 3/2004 | Tsutsumi et al. |
| 9,865,211 B2 | 1/2018 | Cao |

(Continued)

FOREIGN PATENT DOCUMENTS

| CN | 2682446 Y | 3/2005 |
| CN | 101169531 A | 4/2008 |

(Continued)

OTHER PUBLICATIONS

International Search Report of PCT/CN2019/071809 in Chinese, dated Mar. 29, 2019, with English translation.

(Continued)

*Primary Examiner* — Nicholas J Lee
(74) *Attorney, Agent, or Firm* — Collard & Roe, P.C.

(57) ABSTRACT

An array substrate, a display panel and a display device are provided. The array substrate includes a plurality of gate lines and a plurality of data lines. The plurality of gate lines and the plurality of data lines define rows of sub-pixel regions, each of the sub-pixel regions includes two thin film transistors and a pixel electrode, and the two thin film transistors are both connected with the pixel electrode. Gate electrodes of two thin film transistors in an (n)th row of sub-pixel regions of the rows of sub-pixel regions are (Continued)

respectively connected with an (n)th gate line and an (N+1)th gate line of the plurality of gate lines, $K \geq n \geq 1$, n and K are integers, and K is an amount of rows of the sub-pixel regions.

18 Claims, 4 Drawing Sheets

(56) References Cited

U.S. PATENT DOCUMENTS

| | | | |
|---|---|---|---|
| 2008/0129670 A1* | 6/2008 | Ma | G02F 1/136213 345/88 |
| 2011/0019117 A1 | 1/2011 | Xue et al. | |
| 2019/0027074 A1 | 1/2019 | Zeng | |
| 2019/0086751 A1 | 3/2019 | Hao | |

FOREIGN PATENT DOCUMENTS

| | | |
|---|---|---|
| CN | 101281310 A | 10/2008 |
| CN | 101963723 A | 2/2011 |
| CN | 102955313 A | 3/2013 |
| CN | 103700355 A | 4/2014 |
| CN | 107272292 A | 10/2017 |
| CN | 107315291 A | 11/2017 |
| CN | 107561801 A | 1/2018 |
| CN | 108628049 A | 10/2018 |

OTHER PUBLICATIONS

Notice of Transmittal of the International Search Report of PCT/CN2019/071809 in Chinese, dated Mar. 29, 2019.
Written Opinion of the International Searching Authority of PCT/CN2019/071809 in Chinese, dated Mar. 29, 2019 with English translation.
Chinese Office Action in Chinese Application No. 201810549269.3, dated Apr. 10, 2020 with English translation.

* cited by examiner

ARRAY SUBSTRATE, DISPLAY PANEL AND DISPLAY DEVICE

CROSS REFERENCE TO RELATED APPLICATIONS

This application is the National Stage of PCT/CN2019/071809 filed on Jan. 15, 2019, which claims priority under 35 U.S.C. § 119 of Chinese Application No. 201810549269.3 filed on May 31, 2018, the disclosure of which is incorporated by reference.

TECHNICAL FIELD

Embodiments of the disclosure relate to an array substrate, a display panel and a display device.

BACKGROUND

With the development of display technology, the resolution of a display screen is continuously increasing, and special display technologies such as 3D display technology and touch display technology are also continuously applied to display products. All of these development trends require that the display screen can accurately write data signals in a shorter time.

For a liquid crystal display, the conductivity of a Thin Film Transistor (TFT) is usually improved by changing a material of an active layer, so as to realize fast writing of data signals. However, when the material of the active layer is changed, the manufacturing process of the active layer needs to be adjusted accordingly, which results in that the manufacturing process is not mature enough for a period of time, resulting in low product yield.

SUMMARY

The embodiments of the present disclosure provide an array substrate, a display panel, and a display device. At least one embodiment of the present disclosure provides an array substrate. The array substrate includes a plurality of gate lines and a plurality of data lines, the plurality of gate lines and the plurality of data lines define rows of sub-pixel regions; each of the sub-pixel regions are provided with two thin film transistors; and the two thin film transistors are both connected with a pixel electrode of a sub-pixel region where the two thin film transistors are located. Gate electrodes of two thin film transistors in a sub-pixel region in an (n)th row of the rows of sub-pixel regions are respectively connected with an (n)th gate line and an (n+1)th gate line of the plurality of gate lines, K≥n≥1, n and K are integers, and K is an amount of rows of the sub-pixel regions.

In one example of the embodiments of the present disclosure, the two thin film transistors are respectively located on a first side and a second side of the sub-pixel region where the two thin film transistors are located, the first side and the second side are oppositely disposed, and the first side and the second side are sides of the sub-pixel region where the two thin film transistors are located near the gate lines.

In another example of the embodiments of the present disclosure, thin film transistors connected with an (m)th gate line of the plurality of gate lines are symmetrically arranged on both sides of the (m)th gate line, K≥m≥2, and m is an integer.

In another example of the embodiments of the present disclosure, the two thin film transistors each includes an active layer, and a source electrode and a drain electrode which are both arranged on the active layer, and two thin film transistors symmetrically arranged on both sides of a same gate line share one source electrode.

In another example of the embodiments of the present disclosure, a part of a data line connected with each of the two thin film transistors is reused as a source electrode of the each of the two thin film transistors.

In another example of the embodiments of the present disclosure, an amount of sub-pixel regions in each row of the rows of sub-pixel regions is equal, sub-pixel regions in adjacent rows are staggered with respect to each other, thin film transistors in an (a)th sub-pixel region of each row of the rows of sub-pixel regions are both connected with a same data line, L≥a≥1, a and L are integers, and L is an amount of sub-pixel regions in each row of the rows of sub-pixel regions.

In another example of the embodiments of the present disclosure, the plurality of data lines each has a rectangular wave shape.

In another example of the embodiments of the present disclosure, the rows of sub-pixel regions includes three types of sub-pixel regions that are of red, green and blue, respectively, any two adjacent sub-pixel regions are sub-pixel regions of different types, and the two adjacent sub-pixel regions are two sub-pixel regions of a same row or different rows.

In another example of the embodiments of the present disclosure, the array substrate further includes a drive module, the drive module includes K+2 gate drive units arranged in cascade, a first gate drive unit of the K+2 gate drive units is connected with a first gate line of the plurality of gate lines, a last gate drive unit of the K+2 gate drive units is connected with a last gate line of the plurality of gate lines, a (s)th gate drive unit of the K+2 gate drive units is simultaneously connected with a (s−1)th gate line and a (s)th gate line of the plurality of gate lines, and K+1≥s≥2.

In another example of the embodiments of the present disclosure, the drive module further includes A gate drive units, the A gate drive units are not connected with any one of the plurality of gate lines, and A is a positive integer. A (A+1)th gate drive unit is connected with the first gate line, (A+2)th to (K+1+A)th gate drive units are respectively connected with two gate lines of the plurality of gate lines, and a (K+2+A)th gate drive unit is connected with the last gate line.

In another example of the embodiments of the present disclosure, the gate drive unit includes a charging sub-unit, a buffer sub-unit, a pull-up sub-unit, a holding sub-unit, and a discharging sub-unit. The buffer sub-unit is configured to receive an input voltage signal and charge the charging sub-unit by using the input voltage signal; the pull-up sub-unit includes two output terminals, and the pull-up sub-unit is configured to pull up a voltage of the charging sub-unit under control of a timing signal and output a gate high level through the two output terminals in a working stage; the holding sub-unit is configured to control the two output terminals of the pull-up sub-unit to continuously output a low level during other stages other than the working stage; the discharging sub-unit is configured to control the charging sub-unit to discharge after end of the working stage.

In another example of the embodiments of the present disclosure, the charging sub-unit includes a capacitor C; the buffer sub-unit includes a first transistor T1, a source electrode of the first transistor T1 is connected with an input voltage signal IN, a gate electrode of the first transistor T1 is connected with the source electrode of the first transistor T1, and a drain electrode of the first transistor T1 is connected with a first terminal of the capacitor C; the pull-up sub-unit includes a second transistor T2 and a third transistor T3, a source electrode of the second transistor T2 is connected with a clock signal CLK and a source electrode of the third transistor T3, a gate electrode of the second transistor T2 and a gate electrode of the third transistor T3 are both connected with the first terminal of the capacitor C, a drain electrode of the second transistor T2 is connected with a second terminal of the capacitor C and a first output terminal, and a drain electrode of the third transistor T3 is connected with a second output terminal; the holding sub-unit includes a fourth transistor T4, a fifth transistor T5, and a sixth transistor T6, a source electrode of the fourth transistor T4 is connected with a continuous high-level signal GCH, a gate electrode of the fourth transistor T4 is connected with the source electrode of the fourth transistor T4, a drain electrode of the fourth transistor T4 is connected with a source electrode of the fifth transistor T5 and a gate electrode of the sixth transistor T6, a gate electrode of the fifth transistor T5 is connected with the first terminal of the capacitor C, a drain electrode of the fifth transistor T5 is connected with a continuous low-level signal VGL, a source electrode of the sixth transistor T6 is connected with the second terminal of the capacitor C, and a drain electrode of the sixth transistor T6 is connected with the continuous low-level signal VGL. The discharging sub-unit includes a seventh transistor T7 and an eighth transistor T8, a source electrode of the seventh transistor T7 is connected with a reset signal, a gate electrode of the seventh transistor T7 is connected with the drain electrode of the fourth transistor T4, a drain electrode of the seventh transistor T7 is connected with a gate electrode of the eighth transistor T8, a source electrode of the eighth transistor T8 is connected with the drain electrode of the first transistor T1, and a drain electrode of the eighth transistor T8 is connected with a continuous low-level signal VSS.

In another example of the embodiments of the present disclosure, the drive module further includes a data drive unit, the data drive unit is configured to input data signals to the plurality of data lines in a column inversion mode, and sub-pixel units connected with a same data line are a column of sub-pixel units.

At least one embodiment of the present disclosure further provides a display panel including the array substrate.

At least one embodiment of the present disclosure further provides a display device including the display panel.

BRIEF DESCRIPTION OF THE DRAWINGS

The embodiments of the present disclosure will be described in more detail below with reference to the accompanying drawings in order to enable those of ordinary skill in the art to more clearly understand the embodiments of the present disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is apparent that the described embodiments are just a part but not all of the embodiments of the disclosure. Based on the described embodiments herein, those skilled in the art can obtain other embodiment, without any creative work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

Figure 1:
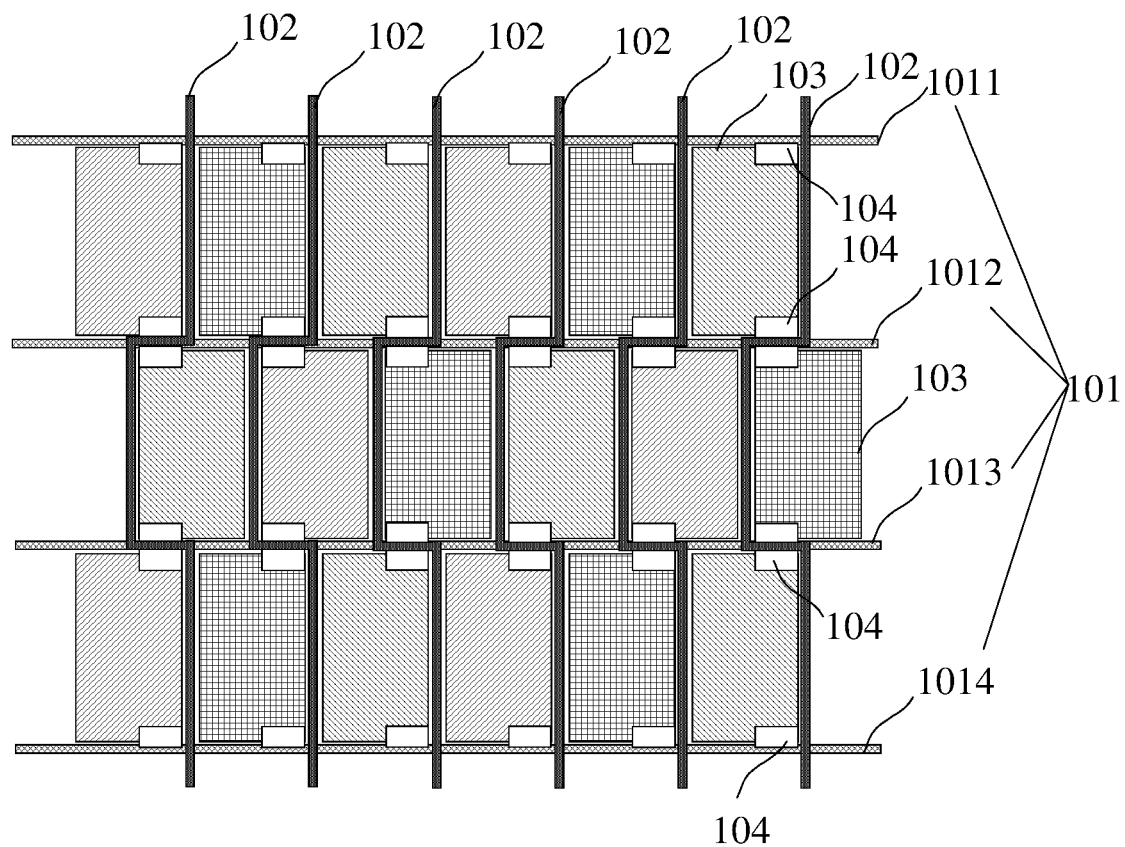
FIG. 1 is a schematic structural diagram of an array substrate provided by at least one embodiment of the present disclosure.
Figure 2A:
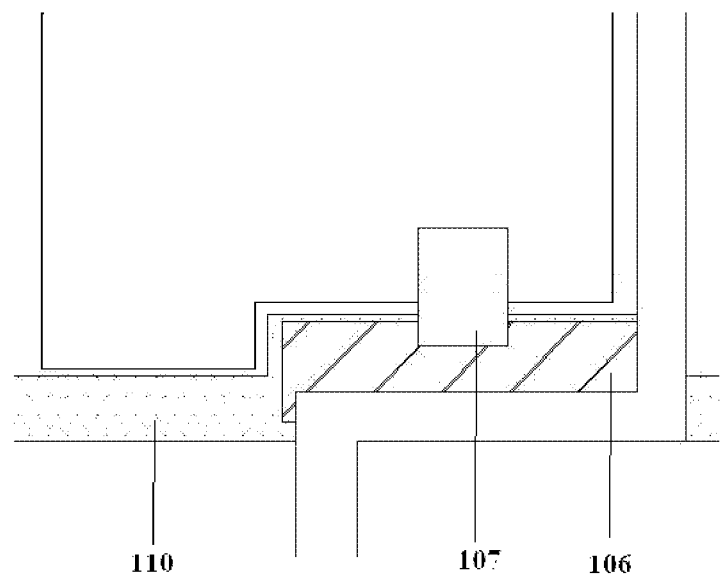
FIG. 2A and FIG. 2B are enlarged views of a partial structure of an array substrate provided by at least one embodiment of the present disclosure.
Figure 2B:
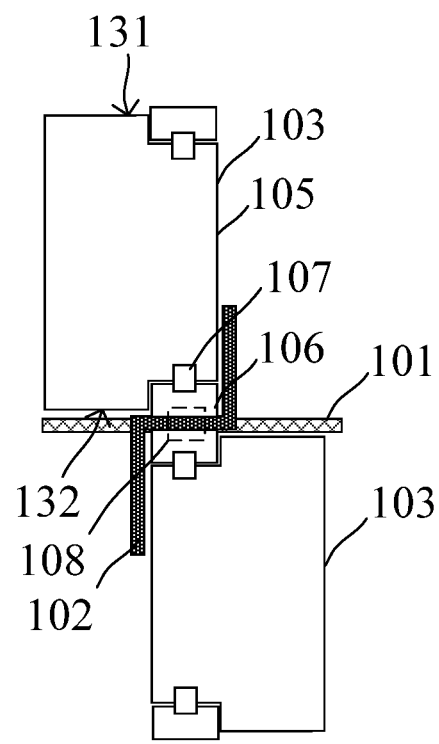

FIG. 1 is a schematic structural diagram of an array substrate provided by at least one embodiment of the present disclosure, referring to FIG. 1, the array substrate includes a plurality of gate lines, commonly referred to as gate lines 101, and a plurality of data lines, commonly referred to as data lines 102. The gate lines 101 and the data lines 102 define rows of sub-pixel regions 103, and two TFTs 104 are provided in each of the sub-pixel regions 103. FIG. 2A and FIG. 2B are enlarged views of a partial (single sub-pixel region and two sub-pixel regions) structure of the array substrate provided by the embodiment of the present disclosure, referring to FIG. 2B, the two TFTs 104 are both connected with a pixel electrode 105 of a sub-pixel region 103 where the two TFT are located.

Referring to FIG. 1, gate electrodes of two TFTs 104 in a sub-pixel region in an (n)th row of the rows of sub-pixel regions 103 are respectively connected with an (n)th gate line 101 and an (n+1)th gate line 101 of the plurality of gate lines 101, K≥n≥1, n and K are integers, and K is an amount of rows of the sub-pixel regions 103. For example, as shown in FIG. 1, gate electrodes of two TFTs 104 in a first row of sub-pixel regions 103 of the rows of sub-pixel regions are respectively connected with a first gate line 1011 and a second gate line 1012 of the plurality of gate lines 101. Gate electrodes of two TFTs 104 in a second row of sub-pixel regions 103 of the rows of sub-pixel regions are respectively connected with the second gate line 1012 and a third gate line 1013 of the plurality of gate lines 101. Gate electrodes of two TFTs 104 in a third row of sub-pixel regions 103 of the rows of sub-pixel regions are respectively connected with the third gate line 1013 and a fourth gate line 1014 of the plurality of gate lines 101, and so on.

Although only three rows of sub-pixel regions are shown in FIG. 1, it is easy to think that the embodiment of the present disclosure may have more or less than three rows of sub-pixel regions, and is not limited to the example as shown in FIG. 1.

According to the embodiments of the present disclosure, two thin film transistors are arranged in each sub-pixel region to charge a pixel electrode in corresponding sub-pixel region, and one gate line (except the first one and the last one) is simultaneously connected with thin film transistors in two adjacent rows of sub-pixel regions. When a certain gate line is loaded with a voltage, thin film transistors in two rows of sub-pixel regions adjacent to the gate line are simultaneously turned on, at this time, a previous row of sub-pixel regions of the two rows of sub-pixel regions can be charged through a data line, and a next row of sub-pixel regions of the two rows of sub-pixel regions can be pre-charged at the same time. In this way, the time required for charging the next row of subpixel regions becomes shorter, so that this design can shorten the charging time of other rows of subpixel regions except the first row and the last row of subpixel regions, and can realize accurate writing of pixel voltages in a shorter time.

In addition, the above scheme does not affect the display effect. For example, for a full high definition (FHD) resolution (1920*1080) product, an opening time of each row of gate electrodes is about 8.6 ns, and the opening time is very short, so that the human eyes cannot recognize the change of pixel luminance during a pre-charging stage. Therefore, the pre-charging technique has no effect on the actual display.

Referring to FIG. 2B, in one example of the embodiment of the present disclosure, the two TFTs 104 are respectively located on a first side 131 and a second side 132 of the sub-pixel region 103 where the two TFTs are located, the first side 131 and the second side 132 are oppositely disposed, the first side 131 and the second side 132 are sides of the sub-pixel region 103 where the two TFTs are located near the gate lines. The two TFTs of one sub-pixel region are arranged on sides close to adjacent gate lines, the two sides of the two arranged TFTs are oppositely arranged, the two TFTs are respectively close to gate lines on both sides of the sub-pixel region where the two TFTs are located, and the two TFTs in each sub-pixel region are arranged on a upper side and a lower side of the sub-pixel region, so that a second to a penultimate gate lines can be directly connected with the TFTs in the two adjacent rows of sub-pixel regions, and the wiring design can be facilitated. In addition, setting the TFTs on the sides of the sub-pixel region can occupy the area of the sub-pixel region as little as possible, thus ensuring the aperture ratio, and a larger aperture ratio can enable more light emitted by a backlight source to pass through a display panel, thus achieving the effects of reducing the luminance of the backlight source and reducing the power consumption.

In other examples of the embodiment of the present disclosure, the two TFTs 104 can further be arranged by other ways, for example, the two TFTs are respectively located on the left and right sides of the sub-pixel region 103.

In the embodiment of the present disclosure, TFTs 104 connected with an (m)th gate line 101 of the plurality of gate lines 101 are symmetrically arranged on both sides of the (m)th gate line 101, K≥m≥2, and m is an integer. The TFTs in two rows are symmetrically arranged to further facilitate the gate line to be connected with the TFTs in the two adjacent rows of sub-pixel regions and facilitate the wiring design.

As shown in FIG. 1, the array substrate provided by the embodiment of the present disclosure includes K rows of sub-pixel regions, and correspondingly, K+1 gate lines are arranged. Except the first gate line and the (K+1)th gate line, TFTs connected with other gate lines are arranged on both sides of the other gate lines, and TFTs connected with the gate lines are symmetrically arranged.

In the embodiment of the present disclosure, the TFT 104 may be either a bottom-gate type TFT or a top-gate type TFT.

Taking a bottom-gate type TFT as an example, and referring to FIG. 2A to FIG. 2B, the TFT 104 includes a gate electrode 110 on a substrate, a gate insulating layer, an active layer 106, and a source electrode 108 and a drain electrode 107 on the active layer 106. The gate electrode 110 is connected with a gate line 101. As shown in FIG. 2A to FIG. 2B, the active layer 106 is connected with a pixel electrode 105 through the drain electrode 107, and two TFTs 104 symmetrically arranged on both sides of a same gate line 101 share one source electrode 108. The two TFTs symmetrically arranged on both sides of the same gate line share the same source electrode, so that the area occupied by the source electrode can be reduced, the distance between the source electrode and the drain electrode can be increased, and the width-to-length ratio (W/L) of the TFT can be further increased. By increasing the W/L of the TFT, the working current of the TFT can be increased, and the power consumption can be reduced.

In the embodiment of the present disclosure, a part of a data line 102 connected with each of the two TFTs 104 is reused as a source electrode 108 of the each of the two TFTs, that is, the source electrode 108 is a part of the data line 102 connected with the two TFTs 104. Because the data line is of a linear structure, in a conventional design, it is necessary to design a block electrode to connect with the data line, and the block electrode is the source electrode. In the present disclosure, the part of the data line is directly used as the source electrode, and the block electrode is not designed separately, thus realizing the multiplexing of the data line. By multiplexing the data line as the source electrode, there is no need to connect another block electrode on the basis of the data line, thus further reducing the occupied area of the source electrode, and the part area can be used to increase the channel width of the TFT, thus increasing the W/L of the TFT.

Because the TFT works in a non-saturated region most of the time when it is turned on, a calculation formula of a corresponding working current is:

$$I_{ds}=\tfrac{1}{2}u_n C_{ox}(W/L)[(V_{gs}-V_{th})V_{ds}-V_{ds}^2]$$

Therefore, in a case where the W/L of the TFT increases, the working current $I_{ds}$ of the TFT can be increased. In the above formula, $u_n$ is carrier mobility, $C_{ox}$ is a capacitance of per unit area of the gate insulating layer, $V_{gs}$ is a voltage between the gate electrode and the source electrode, $V_{th}$ is a threshold voltage of the TFT, and $V_{ds}$ is a voltage between the source electrode and the drain electrode.

In addition, by adopting the above-described pixel design, the TFT occupies a small area of the sub-pixel region and the aperture ratio of the display panel is increased, so that more light of the backlight source can pass through the display panel, thereby reducing the luminance of the backlight source and reducing the power consumption of the display panel.

In the embodiment of the present disclosure, an amount of sub-pixel regions 103 in each row of the rows of sub-pixel regions 103 is equal, the sub-pixel regions 103 in adjacent rows are arranged in a staggered manner, TFTs 104 in an (a)th sub-pixel region 103 of each of the rows of sub-pixel regions 103 are both connected with a same data line 102, L≥a≥1, a and L are integers, and L is an amount of sub-pixel regions 103 in each row of the rows of sub-pixel regions 103. For example, in a direction from left to right, TFTs 104 in a first sub-pixel region in each row of the rows of sub-pixel regions 103 is connected with a same data line 102, TFTs 104 in a second sub-pixel region in each row of the rows of sub-pixel regions 103 is connected with a same data line 102, and so on.

Although it is shown in FIG. 1 that a row of sub-pixel regions includes 6 sub-pixel regions, it is easy to think that the embodiments of the present disclosure are not limited thereto, and may include more than 6 or less than 6 sub-pixel regions, for example.

Referring to FIG. 1, a staggered arrangement refers to a row alignment arrangement in which adjacent rows of sub-pixel regions are indented and spaced apart. For example, as shown in FIG. 1, a first row and a third row are arranged in alignment, and a second line has an indent relative to the first line and the third line.

For example, in a case where there are rows of sub-pixel regions, the first row is aligned with rows 3, 5, 7, 9, etc., while the second row is aligned with rows 4, 6, 8, 10, etc. and has an indentation.

In the present disclosure, the TFTs are arranged at the upper side and the lower side, and the data line is adopted to multiplex the source electrode of the TFT. According to the arrangement of the sub-pixel regions, a length of the data line in the horizontal direction between two rows is smaller than a width of each of the sub-pixel regions, which is shorter than that in a case where the sub-pixel regions are arranged in an array, thus facilitating the design of the data line. In addition, the arrangement of the sub-pixel regions can be combined with a design of subsequent red (R), green (G) and blue (B) sub-pixel regions, and different pixel combination modes can be realized, thereby enhancing the display effect.

For example, the embodiments of the present disclosure are not limited to including red, green, and blue sub-pixel regions, and can further include sub-pixel regions of other colors.

In order to facilitate setting and obtain better display effect, the indent between two adjacent rows of sub-pixel regions is half the width of one sub-pixel region, that is, the center of the sub-pixel region of the second row of sub-pixel regions in the two adjacent rows of sub-pixel regions corresponds to the junction of two sub-pixel regions of the first row of sub-pixel regions.

As shown in FIG. 1, the data line 102 has a rectangular wave shape. Because the sub-pixel regions of adjacent rows are arranged in a staggered manner, the TFTs in the (a)th sub-pixel region of each row of sub-pixel regions can be connected by a data line with a rectangular wavy shape.

For example, in order to facilitate the connection of the data line 102 and the TFT 104, the TFT 104 is disposed at a corner of the sub-pixel region, as shown in FIG. 1, the TFTs 104 in the first row of sub-pixel regions are disposed at a upper right corner and a lower right corner of the sub-pixel region, and the TFTs 104 in the second row of sub-pixel regions are disposed at a upper left corner and a lower left corner of the sub-pixel region. FIG. 1 is only an example, in other examples, other arrangements can also be adopted, for example, TFTs 104 in each row of sub-pixel regions in FIG. 1 can be arranged in a upper left corner and a lower left corner of the sub-pixel region, in this case, the data lines in FIG. 1 can be designed in a shape that is horizontally reversed along a left side of the sub-pixel regions corresponding to the second row, however, it is worth noting that TFTs connected with each gate line are no longer symmetrically arranged in this arrangement.

In the embodiments of the present disclosure, three types of sub-pixel regions 103 of red, green and blue are arranged on the array substrate, and any two adjacent sub-pixel regions 103 are sub-pixel regions 103 of different types, and the two adjacent sub-pixel regions are two sub-pixel regions of a same row or different rows. As shown in FIG. 1, any two adjacent sub-pixel regions 103 in a same row are different types of sub-pixel regions 103, any two adjacent sub-pixel regions 103 in different rows are also different types of sub-pixel regions 103, and the sub-pixel regions 103 with different shadows in FIG. 1 represent different types of sub-pixel regions 103. According to this arrangement, the three sub-pixels forming a triangular position (convex shape) in the two adjacent rows are respectively R, G and B sub-pixel region, thus forming a pixel region. Compared with a pixel region formed by three sub-pixels in a same row, the luminous shape is smoother, the graininess is smaller, and the display effect is better. For example, in FIG. 1, the first and second sub-pixel regions of the first row and the first sub-pixel region of the second row are respectively R, G and B sub-pixel regions to form one pixel region, or the second sub-pixel region of the first row and the first and second sub-pixel regions of the second row in FIG. 1 are respectively R, G and B sub-pixel regions to form one pixel region.

In adopting the above RGB sub-pixel regions, the combination of sub-pixel regions can also be in other ways, for example, three sub-pixels side by side in one row form a pixel region. Therefore, the display device made of the array substrate can cooperate with different display algorithms to realize different pixel combinations and enrich the display effect.

In the embodiments of the present disclosure, the array substrate further includes a drive module, and the drive module includes a plurality of gate drive units arranged in cascade. The plurality of gate drive units arranged in cascade, that is, adopting a gate drive mode of a Gate On Array (GOA), and the plurality of gate drive units are arranged on a base substrate of the array substrate. Optionally, the drive module further includes a data drive unit, for example, the data drive unit can be disposed on the base substrate of the array substrate or can not be disposed on the base substrate of the array substrate.

The plurality of gate drive units, which are arranged in cascade, are used for controlling gate lines connected with the plurality of gate drive units to be sequentially loaded with a high voltage. The data drive unit is used for controlling a data line to input display data when the gate line is loaded with the high voltage. Signal driving is performed by the gate drive unit and the data drive unit, so that the display device can normally work.

In the embodiments of the present disclosure, the drive module includes K+2 gate drive units arranged in cascade, a first gate drive unit and a last gate drive unit of the K+2 gate drive units are connected with a gate line, the first gate drive unit of the K+2 gate drive units is connected with a first gate line, the last gate drive unit of the K+2 gate drive units is connected with a last gate line, and a (s)th gate drive unit of the K+2 gate drive units are simultaneously connected with a (s−1)th and a (s)th gate lines, and K+1 In this way, one gate drive unit is connected with two gate lines (that is, an output of one gate drive unit can be used as an input of two gate lines simultaneously), TFTs in three rows of sub-pixel units can be powered up simultaneously, data signals provided by data lines can be written into pixel electrodes through TFTs in the three rows of sub-pixel units, and charging, pre-charging and charge neutralizing are respectively carried out for the three rows of sub-pixel units, thus saving charging time.

An amount of the gate lines on the array substrate is K+1, K+2 gate drive units are designed, a first gate drive unit is connected with the first gate line, a second gate drive unit is connected with the first gate line and a second gate line, a third gate drive unit is connected with the second gate line and a third gate line, and so on.

Optionally, the drive module further includes A gate drive units, the A gate drive units are not connected with any one of the gate lines, and A is a positive integer. A (A+1)th gate drive unit is connected with the first gate line, (A+2)th to (K+1+A)th gate drive units are respectively connected with two gate lines, and a (K+2+A)th gate drive unit is connected with the last gate line. The A grid drive units are arranged in front of a display region and are not connected with any one of the gate lines, so that the unstable starting of the gate drive unit and the influence on the normal operation of the display device are avoided. The A gate drive units and the K+2 gate drive units are also arranged in cascade, and the A gate drive units are positioned before the K+2 gate drive units.

The operation process of the drive module will be described below with some examples.

When the drive module works, each of the gate drive units outputs a drive signal to two gate lines simultaneously. When an (A+1)th gate drive unit works, the first gate line connected with the (A+1)th gate drive unit loads a high level of a gate electrode, one row of TFTs in the first row of sub-pixel units are turned on, and at this time, electric signals are written through the data lines to neutralize the electric quantity of the first row of sub-pixel units. When an (A+2)th gate drive unit works, the first and second gate lines connected with the (A+2)th gate drive unit are loaded with the high level of the gate electrode, and two rows of TFTs in the first row of sub-pixel units and one row of TFTs in the second row of sub-pixel units are turned on. At this time, electric signals are written through data lines to pre-charge the first row of sub-pixel units and neutralize the electric quantity of the second row of sub-pixel units. When an (A+3)th gate drive unit works, the second and third gate lines connected with the (A+3)th gate drive unit are loaded with the high level of the gate electrode, another row of TFTs in the first row of sub-pixel units, two rows of TFTs in the second row of sub-pixel units, and one row of TFTs in the third row of sub-pixel units are turned on, at this time, electric signals are written through data lines to charge the first row of sub-pixel units, pre-charge the second row of sub-pixel units, and neutralize the electric quantity of the third row of sub-pixel units, and so on. In this design, because each of the gate drive units is connected with two gate lines, each row of sub-pixel units can be charged when three consecutive gate drive units work, thus shortening a working time of each of the gate drive units, that is, prolonging a charging time of each row of sub-pixel unis. Because voltage polarities of the pixel electrodes of two adjacent frames of images are opposite, the voltage left in the previous frame can be neutralized by electric quantity neutralization, and then performing a pre-charge to make the voltage close to a target voltage, and finally performing a charge to make the voltage reach the target voltage.

Figure 3:
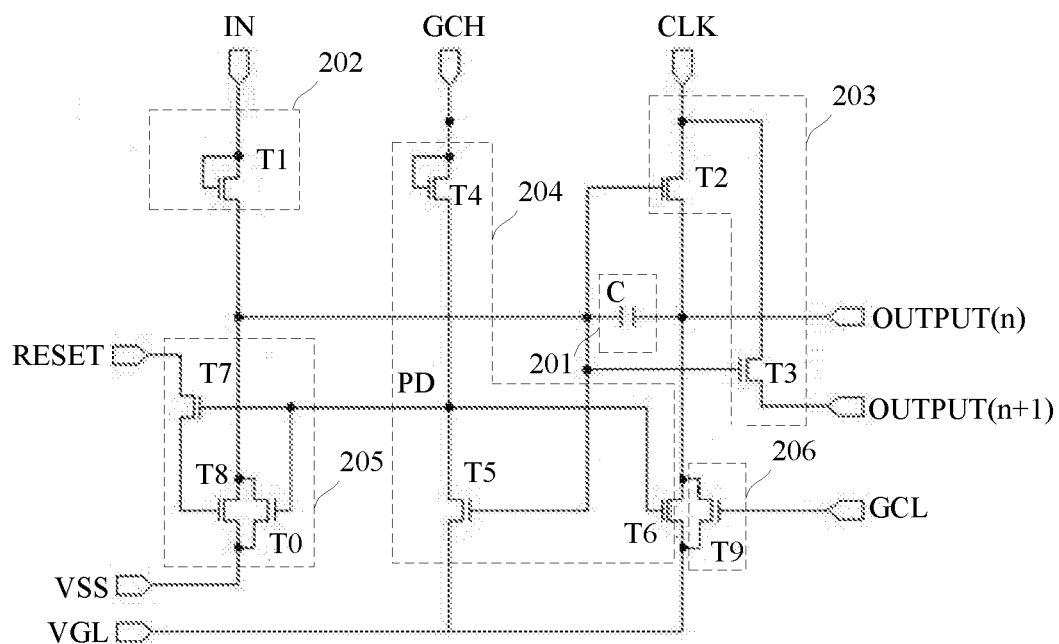
FIG. 3 is a schematic structural diagram of a gate drive unit provided by at least one embodiment of the present disclosure.

FIG. 3 is a schematic structural diagram of a gate drive unit provided by at least one embodiment of the present disclosure, referring to FIG. 3, the gate drive unit includes a charging sub-unit 201, a buffer sub-unit 202, a pull-up sub-unit 203, a holding sub-unit 204, and a discharging sub-unit 205.

The buffer sub-unit 202 is configured to receive an input voltage signal and charge the charging sub-unit 201 by using the input voltage signal IN. The pull-up sub-unit 203 includes two output terminals (a first output terminal OUTPUT(n) and a second output terminal OUTPUT(n+1)), and the pull-up sub-unit 203 is used to pull up a voltage of the charging sub-unit under control of a timing signal and output a gate high level through the two output terminals in a working stage. The holding sub-unit 204 is configured to control the two output terminals of the pull-up sub-unit to continuously output a low level during other stages other than the working stage. The discharging sub-unit 205 is configured to control the charging sub-unit to discharge after end of the working stage. By designing the structure of the gate drive unit, the gate drive is ensured. In addition, the gate drive unit includes two output terminals, which can charge two gate lines simultaneously, and saving the charging time.

The working stage is a period of time when the charging sub-unit is discharging and outputting a gate high level after the pull-up sub-unit 203 pulls up the voltage of the charging sub-unit.

The input voltage signal IN is an output signal of the gate drive unit of a previous stage, or a start voltage signal (STV).

Referring to FIG. 3, the charging sub-unit 201 includes a capacitor c. The buffer sub-unit 202 includes a first transistor T1, a source electrode of the first transistor T1 is connected with the input voltage signal IN, a gate electrode of the first transistor T1 is connected with the source electrode of the first transistor T1, and a drain electrode of the first transistor T1 is connected with a first terminal of the capacitor C. The pull-up sub-unit 203 includes a second transistor T2 and a third transistor T3. A source electrode of the second transistor T2 is connected with a clock signal CLK and a source electrode of the third transistor T3, a gate electrode of the second transistor T2 and a gate electrode of the third transistor T3 are both connected with the first terminal of the capacitor C, a drain electrode of the second transistor T2 is connected with a second terminal of the capacitor C and the first output terminal OUTPUT(n), and a drain electrode of the third transistor T3 is connected with the second output terminal OUTPUT(n+1). The holding sub-unit 204 includes a fourth transistor T4, a fifth transistor T5, and a sixth transistor T6. A source electrode of the fourth transistor T4 is connected with a continuous high-level signal GCH, a gate electrode of the fourth transistor T4 is connected with the source electrode of the fourth transistor T4, a drain electrode of the fourth transistor T4 is connected with a source electrode of the fifth transistor T5 and a gate electrode of the sixth transistor T6, a gate electrode of the fifth transistor T5 is connected with the first terminal of the capacitor C, a drain electrode of the fifth transistor T5 is connected with a continuous low-level signal VGL, a source electrode of the sixth transistor T6 is connected with the second terminal of the capacitor C, and a drain electrode of the sixth transistor T6 is connected with the continuous low-level signal VGL. The discharge sub-unit 205 includes a seventh transistor T7 and an eighth transistor T8. A source electrode of the seventh transistor T7 is connected with a reset signal RESET, a gate electrode of the seventh transistor T7 is connected with the drain electrode of the fourth transistor T4, a drain electrode of the seventh transistor T7 is connected with a gate electrode of the eighth transistor T8, a source electrode of the eighth transistor T8 is connected with the drain electrode of the first transistor T1, and a drain electrode of the eighth transistor T8 is connected with a continuous low-level signal VSS.

Figure 4:
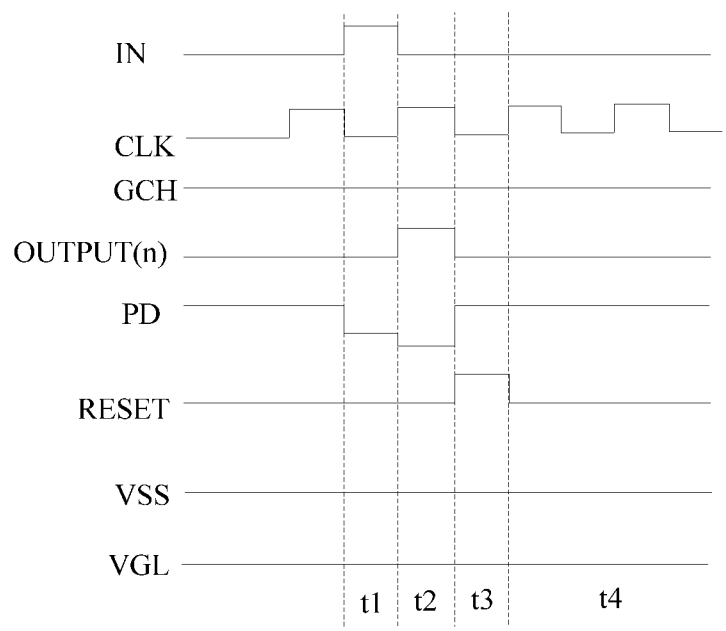
FIG. 4 is a signal timing diagram provided by at least one embodiment of the present disclosure.
Figure 5:
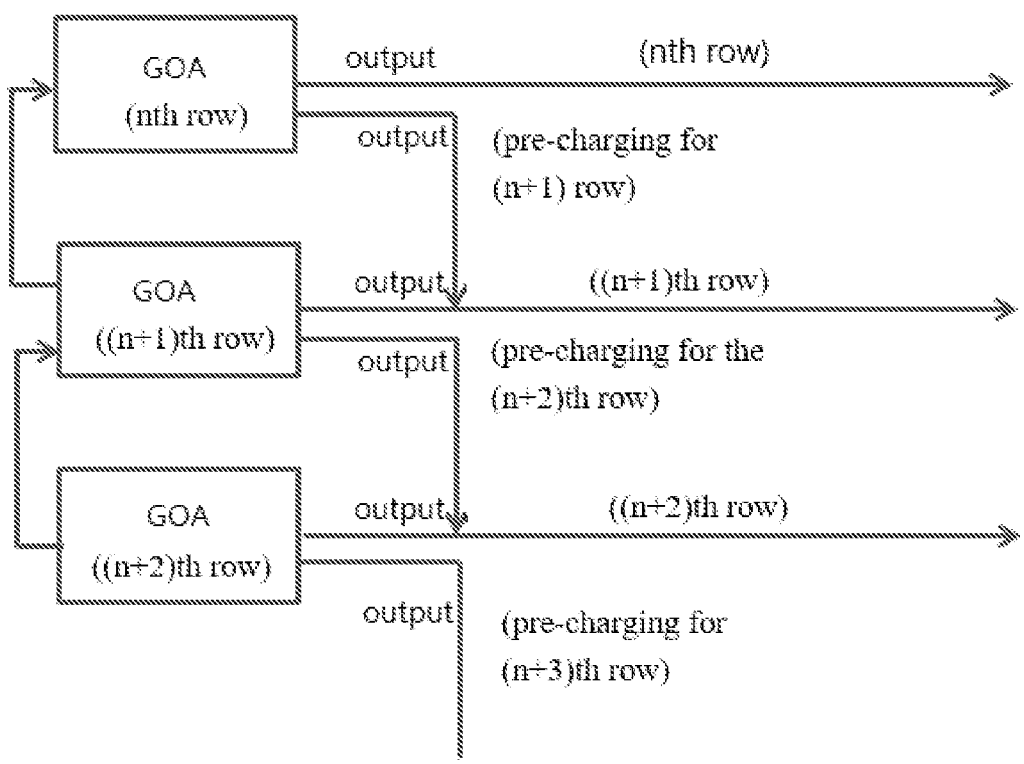
FIG. 5 is a diagram of a drive module provided by at least one embodiment of the present disclosure.

FIG. 4 is a schematic diagram of signal timing provided by at least one embodiment of the present disclosure, the operation process of the gate drive unit provided by FIG. 3 will be described below with reference to FIG. 4.

A charging stage t1: when IN is at a high level, T1 is turned on, and a potential of the first terminal of capacitor C rises to charge the capacitor C.

When the capacitor C is charged, the potential of the first terminal of the capacitor C reaches the threshold voltage of the transistor T5, T5 is turned on, and a potential of PD node is pulled down under control of the low level VGL.

A working stage t2: when the high level of IN ends, CLK reaches a high level, and at this time, the potential of the first terminal of the capacitor C is further pulled up under a bootstrap effect. The potential of the first terminal of the capacitor C reaches the threshold voltage of transistors T2 and T3, T2 and T3 are turned on, and the two output terminals output a high level of CLK as gate high level. In this process, because the potential of the first terminal of the capacitor C is further raised, after a voltage of the gate electrode of T5 is pulled up for a second time, a working current of T5 is raised, and the potential of the PD node is pulled down for a second time.

In this stage, because the potential of PD node is at a low level, T6 is turned off, and VGL cannot be applied to the two output terminals, thereby avoiding the output terminals from being pulled down in advance by VGL when the output terminals output the gate high level, and avoiding the abnormal signals.

A discharging stage t3: When the reset signal RESET is at a high level, T8 is turned on. Under control of a low level of VSS, the potential of the first terminal of the capacitor C is rapidly pulled down, and T2, T3 and T5 are turned off. When T5 is turned off, PD node returns to a high potential, T6 is turned on, VGL is applied to the output terminal OUTPUT(n), and output terminal OUTPUT(n) outputs a low level. When T2 and T3 are turned off, the output terminal OUTPUT(n+1) is at a low level.

A holding stage T4: PD node keeps the high potential under control of GCH, T6 is turned on, VGL is continuously applied to the output terminal OUTPUT(n), and the output terminal OUTPUT(n) outputs a low level. Because T2 and T3 keep in a state of turn-off, the output terminal OUTPUT(n) also keeps a low level.

For example, the gate drive unit further includes a reset unit 206, and the reset unit 206 is used for resetting the signal of the charging sub-unit at end of one frame of scanning. As shown in FIG. 3, the reset unit 206 includes a ninth transistor T9, a source electrode of the ninth transistor T9 is connected with the source electrode of the sixth transistor T6, a drain electrode of the ninth transistor T9 is connected with the drain electrode of the sixth transistor T6, and a gate electrode of the ninth transistor T9 is connected with a control signal GCL. The control signal GCL is at a high level at the end of one frame of scanning, and the control signal GCL controls T9 to be turned on, thereby writing VGL to the capacitor C. Of course, in this structure, VGL can be written without T9. Referring to FIG. 3, VGL can be written through T6, and setting T9 can ensure that signal reset can still be performed in a case where T6 fails.

For example, T9 can also be used as a reserved test lighting switch. By replacing VGL and GCL signals with high-level signals, T6 is turned on, and the output terminal OUTPUT(n) outputs a high level, thereby implementing a lighting test.

Optionally, the discharging sub-unit 205 can further include a tenth transistor T0, a gate electrode of the tenth transistor T0 is connected with the drain electrode of the fourth transistor T4, a source electrode of the tenth transistor T0 is connected with the source electrode of the eighth transistor T8, and a drain electrode of the tenth transistor T0 is connected with the drain electrode of the eighth transistor T8. In the charging stage t1 and the working stage t2, the PD node is at a low potential, so that T0 is turned off, which does not affect the charging of the capacitor C in the charging stage t1 and the outputting of the output terminal in the working stage t2. In the discharging stage t3, the PD node returns to a high potential, T0 is turned on, and the discharging of the capacitor C is accelerated.

In the timing chart as shown in FIG. 4, RESET is a signal shift after IN, so that RESET is also obtained according to the output signal of the gate drive unit of the previous stage or the start voltage signal (STV), which is convenient for circuit design. In other examples, RESET can also be controlled by an independent signal.

For example, the first to tenth transistors may be metal-oxide-semiconductor field-effect transistors (MOSFET).

In the embodiments of the present disclosure, the drive module further includes a data drive unit, and the date drive unit is used for inputting data signals to the data lines in a column inversion mode. Sub-pixel units connected with a same data line are a column of sub-pixel units. Using the column inversion mode can achieve a display effect similar to that of the dot inversion mode, the flicker problem of a liquid crystal display panel adopting the dot inversion mode is minimized, and the column inversion mode is simpler than that of the dot inversion mode.

Polarity inversion refers to that when a same sub-pixel is displayed, the written voltages of one frame and the next frame are opposite in polarity. In this way, the voltage of the next frame will be written to neutralize the original voltage of opposite polarity in the sub-pixel before writing the target voltage. According to the present disclosure, the scanning lines are turned on in advance by pre-charging, so that voltage neutralization and pre-writing are realized, and charging time is shortened. Polar inversion includes frame inversion, column inversion, dot inversion, etc. Column inversion refers to that polarities of voltages of sub-pixels in adjacent columns are opposite, that is, polarities of voltages of adjacent sub-pixels in a same row are opposite, and polarities of voltages of adjacent sub-pixels in a same column are same. Point inversion refers to that polarities of voltages of any adjacent sub-pixels are opposite. Because the sub-pixels of a same column are arranged in a staggered arrangement in the present disclosure, in a case where the column inversion mode is used for driving, not only the polarities of voltages of adjacent sub-pixels in a same row are opposite, but also the polarities of voltages of adjacent sub-pixels in a longitudinal direction are opposite, for example, in FIG. 1, the second sub-pixel in the first row and the first sub-pixel in the second row implement a similar effect of the dot inversion.

The embodiments of the present disclosure further provide a display panel, and the display panel includes any of the above array substrates, such as the array substrate as shown in FIG. 1.

According to the embodiments of the present disclosure, two thin film transistors are arranged in each sub-pixel region to charge a pixel electrode in corresponding sub-pixel region, and one gate line (except the first one and the last one) is simultaneously connected with thin film transistors in two adjacent rows of sub-pixel regions. When a certain gate line is loaded with a voltage, thin film transistors in two rows of sub-pixel regions adjacent to the gate line are simultaneously turned on. At this time, a previous row of sub-pixel regions of the two rows of sub-pixel regions can be charged through a data line, and a next row of sub-pixel regions of the two rows of sub-pixel regions can be pre-charged at the same time. In this way, the time required for charging the next row of sub-pixel regions becomes shorter, so that this design can shorten the charging time of other rows of sub-pixel regions except the first row and the last row of sub-pixel regions, and can realize accurate writing of pixel voltages in a shorter time.

The embodiments of the disclosure further provide a display device, which includes the display panel. For example, the display device provided by the embodiment of the present disclosure may be any product or component with a display function such as a mobile phone, a tablet computer, a television, a display, a notebook computer, a digital photo frame, a navigator, etc.

According to the embodiments of the present disclosure, two thin film transistors are arranged in each sub-pixel region to charge a pixel electrode in corresponding sub-pixel region, and one gate line (except the first one and the last one) is simultaneously connected with thin film transistors in two adjacent rows of sub-pixel regions. When a certain gate line is loaded with a voltage, thin film transistors in two rows of sub-pixel regions adjacent to the gate line are simultaneously turned on. At this time, a previous row of sub-pixel regions of the two rows of sub-pixel regions can be charged through a data line, and a next row of sub-pixel regions of the two rows of sub-pixel regions can be pre-charged at the same time. In this way, the time required for charging the next row of sub-pixel regions becomes shorter, so that this design can shorten the charging time of other rows of sub-pixel regions except the first row and the last row of sub-pixel regions, and can realize accurate writing of pixel voltages in a shorter time.

The above is only some example embodiments of the present disclosure and are not intended to limit the present disclosure. Any modification, equivalent substitution, improvement, etc. made within the principles of the present disclosure shall be included within the scope of protection of the present disclosure.

What is claimed is:

1. An array substrate, comprising a plurality of gate lines and a plurality of data lines,
   wherein the plurality of gate lines and the plurality of data lines define rows of sub-pixel regions, each of the sub-pixel regions comprise two thin film transistors and a pixel electrode, and the two thin film transistors are both connected with the pixel electrode;
   gate electrodes of two thin film transistors in a sub-pixel region in an (n)th row of the rows of sub-pixel regions are respectively connected with an (n)th gate line and an (n+1)th gate line of the plurality of gate lines, $K \geq n \geq 1$, n and K are integers, and K is an amount of rows of the sub-pixel regions; and
   a drive circuit;
   wherein the drive circuit comprises K+2 gate drive circuits arranged in cascade, a first gate drive circuit of the K+2 gate drive circuits is connected with a first gate line of the plurality of gate lines, a last gate drive circuit of the K+2 gate drive circuits is connected with a last gate line of the plurality of gate lines, a (s)th gate drive circuit of the K+2 gate drive circuits is simultaneously connected with a (s−1)th gate line and a (s)th gate line of the plurality of gate lines, and $K+1 \geq s \geq 2$.

2. The array substrate according to claim 1, wherein the two thin film transistors in the sub-pixel region in the (n)th row are respectively located on a first side and a second side of the sub-pixel region in the (n)th row, the first side and the second side are oppositely disposed, and the first side and the second side are sides of the sub-pixel region where the two thin film transistors are located near the (n)th gate line and the (n+1)th gate line.

3. The array substrate according to claim 2, wherein thin film transistors connected with an (m)th gate line of the plurality of gate lines are symmetrically arranged on both sides of the (m)th gate line, $K \geq m \geq 2$, and m is an integer.

4. The array substrate according to claim 3, wherein the two thin film transistors each comprises an active layer, and a source electrode and a drain electrode which are both arranged on the active layer, and two thin film transistors symmetrically arranged on both sides of a same gate line share one source electrode formed by source electrodes of the two thin film transistors.

5. The array substrate according to claim 4, wherein a part of a data line connected with each of the two thin film transistors is reused as a source electrode of the each of the two thin film transistors in the sub-pixel region in the (n)th row.

6. A display panel, comprising the array substrate according to claim 5.

7. The array substrate according to claim 1, wherein thin film transistors connected with an (m)th gate line of the plurality of gate lines are symmetrically arranged on both sides of the (m)th gate line, $K \geq m \geq 2$, and m is an integer.

8. The array substrate according to claim 1, wherein the two thin film transistors each comprises an active layer, and a source electrode and a drain electrode which are both arranged on the active layer, and two thin film transistors symmetrically arranged on both sides of a same gate line share one source electrode formed by source electrodes of the two thin film transistors.

9. The array substrate according to claim 1, wherein a part of a data line connected with each of the two thin film transistors is reused as a source electrode of the each of the two thin film transistors in the sub-pixel region in the (n)th row.

10. The array substrate according to claim 1, wherein an amount of sub-pixel regions in each row of the rows of sub-pixel regions is equal, and sub-pixel regions in adjacent rows are staggered with respect to each other; and
    thin film transistors in an (a)th sub-pixel region of each row of the rows of sub-pixel regions are both connected with a same data line, $L \geq a \geq 1$, a and L are integers, and L is an amount of sub-pixel regions in each row of the rows of sub-pixel regions.

11. The array substrate according to claim 1, wherein the plurality of data lines each has a rectangular wave shape.

12. The array substrate according to claim 1, wherein the rows of sub-pixel regions comprises three types of sub-pixel regions that are of red, green and blue, respectively, any two adjacent sub-pixel regions are sub-pixel regions of different types, and the two adjacent sub-pixel regions are two sub-pixel regions of a same row or different rows.

13. The array substrate of claim 1, wherein the drive circuit further comprises A gate drive circuits, the A gate drive circuits are not connected with any one of the plurality of gate lines, and A is a positive integer; and
- a (A+1)th gate drive circuit is connected with the first gate line, (A+2)th to (K+1+A)th gate drive circuits are respectively connected with two gate lines of the plurality of gate lines, and a (K+2+A)th gate drive circuit is connected with the last gate line.

14. The array substrate according to claim 13, wherein the gate drive circuit comprises:
- a charging sub-circuit;
- a buffer sub-circuit, configured to receive an input voltage signal and charge the charging sub-circuit by using the input voltage signal;
- a pull-up sub-circuit, comprising two output terminals, wherein the pull-up sub-circuit is configured to pull up a voltage of the charging sub-circuit under control of a timing signal and output a gate high level through the two output terminals in a working stage;
- a holding sub-circuit, configured to control the two output terminals of the pull-up sub-circuit to continuously output a low level during other stages other than the working stage; and
- a discharging sub-circuit, configured to control the charging sub-circuit to discharge after end of the working stage.

15. The array substrate according to claim 14,
wherein the charging sub-circuit comprises a capacitor C;
the buffer sub-circuit comprises a first transistor T1, a source electrode of the first transistor T1 is connected with an input voltage signal IN, a gate electrode of the first transistor T1 is connected with the source electrode of the first transistor T1, and a drain electrode of the first transistor T1 is connected with a first terminal of the capacitor C;
the pull-up sub-circuit comprises a second transistor T2 and a third transistor T3, a source electrode of the second transistor T2 is connected with a clock signal CLK and a source electrode of the third transistor T3, a gate electrode of the second transistor T2 and a gate electrode of the third transistor T3 are both connected with the first terminal of the capacitor C, a drain electrode of the second transistor T2 is connected with a second terminal of the capacitor C and a first output terminal, and a drain electrode of the third transistor T3 is connected with a second output terminal;
the holding sub-circuit comprises a fourth transistor T4, a fifth transistor T5, and a sixth transistor T6, a source electrode of the fourth transistor T4 is connected with a continuous high-level signal GCH, a gate electrode of the fourth transistor T4 is connected with the source electrode of the fourth transistor T4, a drain electrode of the fourth transistor T4 is connected with a source electrode of the fifth transistor T5 and a gate electrode of the sixth transistor T6, a gate electrode of the fifth transistor T5 is connected with the first terminal of the capacitor C, a drain electrode of the fifth transistor T5 is connected with a continuous low-level signal VGL, a source electrode of the sixth transistor T6 is connected with the second terminal of the capacitor C, and a drain electrode of the sixth transistor T6 is connected with the continuous low-level signal VGL; and
the discharging sub-circuit comprises a seventh transistor T7 and an eighth transistor T8, a source electrode of the seventh transistor T7 is connected with a reset signal, a gate electrode of the seventh transistor T7 is connected with the drain electrode of the fourth transistor T4, a drain electrode of the seventh transistor T7 is connected with a gate electrode of the eighth transistor T8, a source electrode of the eighth transistor T8 is connected with the drain electrode of the first transistor T1, and a drain electrode of the eighth transistor T8 is connected with a continuous low-level signal VSS.

16. The array substrate according to claim 1, wherein the drive circuit further comprises a data drive circuit,
the data drive circuit is configured to input data signals to the plurality of data lines in a column inversion mode, and sub-pixel circuits connected with a same data line are a column of sub-pixel circuits.

17. A display panel, comprising an array substrate, wherein the array substrate comprises:
a plurality of gate lines and a plurality of data lines,
wherein the plurality of gate lines and the plurality of data lines define rows of sub-pixel regions, each of the sub-pixel regions comprise two thin film transistors and a pixel electrode, and the two thin film transistors are both connected with the pixel electrode;
gate electrodes of two thin film transistors in a sub-pixel region in an (n)th row of the rows of sub-pixel regions are respectively connected with an (n)th gate line and an (n+1)th gate line of the plurality of gate lines, K≥n≥1, n and K are integers, and K is an amount of rows of the sub-pixel regions; and
a drive circuit;
wherein the drive circuit comprises K+2 gate drive circuits arranged in cascade, a first gate drive circuit of the K+2 gate drive circuits is connected with a first gate line of the plurality of gate lines, a last gate drive circuit of the K+2 gate drive circuits is connected with a last gate line of the plurality of gate lines, a (s)th gate drive circuit of the K+2 gate drive circuits is simultaneously connected with a (s−1)th gate line and a (s)th gate line of the plurality of gate lines, and K+1≥s≥2.

18. A display device, comprising a display panel, wherein the display panel comprises:
an array substrate, wherein the array substrate comprises:
a plurality of gate lines and a plurality of data lines,
wherein the plurality of gate lines and the plurality of data lines define rows of sub-pixel regions, each of the sub-pixel regions comprise two thin film transistors and a pixel electrode, and the two thin film transistors are both connected with the pixel electrode;
gate electrodes of two thin film transistors in a sub-pixel region in an (n)th row of the rows of sub-pixel regions are respectively connected with an (n)th gate line and an (n+1)th gate line of the plurality of gate lines, K≥n≥1, n and K are integers, and K is an amount of rows of the sub-pixel regions; and
a drive circuit;
wherein the drive circuit comprises K+2 gate drive circuits arranged in cascade, a first gate drive circuit of the K+2 gate drive circuits is connected with a first gate line of the plurality of gate lines, a last gate drive circuit of the K+2 gate drive circuits is connected with a last gate line of the plurality of gate lines, a (s)th gate drive circuit of the K+2 gate drive circuits is simultaneously connected with a (s−1)th gate line and a (s)th gate line of the plurality of gate lines, and K+1≥s≥2.

* * * * *